United States Patent
Peng et al.

(10) Patent No.: US 7,310,241 B2
(45) Date of Patent: Dec. 18, 2007

(54) AUXILIARY MOUNTING APPARATUS FOR EXPANSION CARDS

(75) Inventors: Wen-Tang Peng, Tu-Cheng (TW); Guang-Yi Zhang, Shenzhen (CN); Hang-Kong Hu, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 0 days.

(21) Appl. No.: 11/504,409

(22) Filed: Aug. 15, 2006

(65) Prior Publication Data

US 2007/0081316 A1 Apr. 12, 2007

(30) Foreign Application Priority Data

Aug. 18, 2005 (CN) .................. 2005 2 0063483 U

(51) Int. Cl.
 *H05K 7/14* (2006.01)
(52) U.S. Cl. ............ 361/801; 361/679; 361/683; 361/695; 361/752; 361/796; 439/160; 439/325; 710/62
(58) Field of Classification Search ............ 361/679, 361/683, 695, 752–754, 796–798, 801, 726, 361/732, 740, 747, 759; 439/160, 325; 710/62; 312/223.1, 223.2, 223.3
See application file for complete search history.

(56) References Cited

U.S. PATENT DOCUMENTS 4,745,524 A   5/1988 Patton, III
5,338,214 A * 8/1994 Steffes et al. ............... 439/160
5,914,854 A * 6/1999 Holt ........................... 361/683
5,936,835 A * 8/1999 Astier ......................... 361/683
6,222,725 B1* 4/2001 Jo .............................. 361/683
6,480,393 B1  11/2002 Chen
6,487,070 B2  11/2002 Gan
6,700,791 B1* 3/2004 Zappacosta .................. 361/759
6,772,246 B2* 8/2004 Kim et al. ..................... 710/62
6,934,161 B2* 8/2005 Kim et al. ................... 361/752
6,950,313 B1* 9/2005 Shih ........................... 361/759
2004/0037048 A1* 2/2004 Liao ............................ 361/726
2004/0174687 A1* 9/2004 Wang et al. ................. 361/801

(Continued)

*Primary Examiner*—Dean A. Reichard
*Assistant Examiner*—Xiaoliang Chen
(74) *Attorney, Agent, or Firm*—Morris Manning Martin LLP; Tim Tingkang Xia, Esq.

(57) ABSTRACT

An exemplary mounting apparatus for aiding in mounting a plurality of long expansion cards in electrical devices includes a locating member, and a retention member rotatably attached to the locating member. The locating member includes a base wall, a pair of sidewalls, and a top wall. Pairs of guiding rails extend from the base wall for slidably receiving ends of the expansion cards opposite to ends with cover plates. Two pairs of first positioning blocks extend from the top wall. The retention member includes a base plate, a pair of flanges, and a pair of resilient arms. A plurality of retaining tabs extends from the base plate to abut against top edges of the expansion cards. The flanges are rotatably attached to the sidewalls of the locating member. The resilient arms each include a pair of second positioning blocks for engaging with the first positioning blocks of the locating member.

17 Claims, 6 Drawing Sheets

U.S. PATENT DOCUMENTS

2005/0059285 A1* 3/2005 Chen et al. ................. 439/325
2006/0232952 A1* 10/2006 Peng et al. ................. 361/796
2007/0030660 A1* 2/2007 Peng et al. ................. 361/801

* cited by examiner

AUXILIARY MOUNTING APPARATUS FOR EXPANSION CARDS

BACKGROUND OF THE INVENTION

1. Field of the Invention

The present invention relates to mounting apparatuses for mounting a plurality of expansion cards in an electronic device, and particularly to an auxiliary mounting apparatus which can aid to securely mount a plurality of expansion cards with long dimensions in an electronic device.

2. Background of the Invention

In order to upgrade the operating capabilities of a personal computer, a plurality of expansion cards is operatively installed in the computer enclosure. Typical types of expansion cards include network cards, sound cards, graphics accelerator cards, multi-media cards, etc.

U.S. Pat. No. 4,745,524 discloses a mounting mechanism for mounting a plurality of expansion cards in a computer chassis. The mounting mechanism includes a pressing element, and a screw to secure a separate cover piece of a corresponding expansion card. However, the mounting mechanism only secures one end of the expansion cards to the computer chassis. If the expansion cards are long, such a mounting mechanism may not stably secure the expansion cards in the computer chassis.

What is needed is to provide a mounting apparatus which can aid to securely mount long expansion cards in electrical devices.

SUMMARY

In a preferred embodiment, a mounting apparatus for aiding in mounting a plurality of long expansion cards in electrical devices includes a locating member, and a retention member rotatably attached to the locating member. The locating member includes a base wall, a pair of sidewalls, and a top wall. Pairs of guiding rails extend from the base wall for slidably receiving ends of the expansion cards opposite to ends with cover plates. Two pairs of first positioning blocks extend from the top wall. The retention member includes a base plate, a pair of flanges, and a pair of resilient arms. A plurality of retaining tabs extends from the base plate to abut against top edges of the expansion cards. The flanges are rotatably attached to the sidewalls of the locating member. The resilient arms each include a pair of second positioning blocks for engaging with the first positioning blocks of the locating member.

Other advantages and novel features of the invention will become more apparent from the following detailed description when taken in conjunction with the accompanying drawings, in which:

DETAILED DESCRIPTION OF THE EMBODIMENTS

Figure 1:
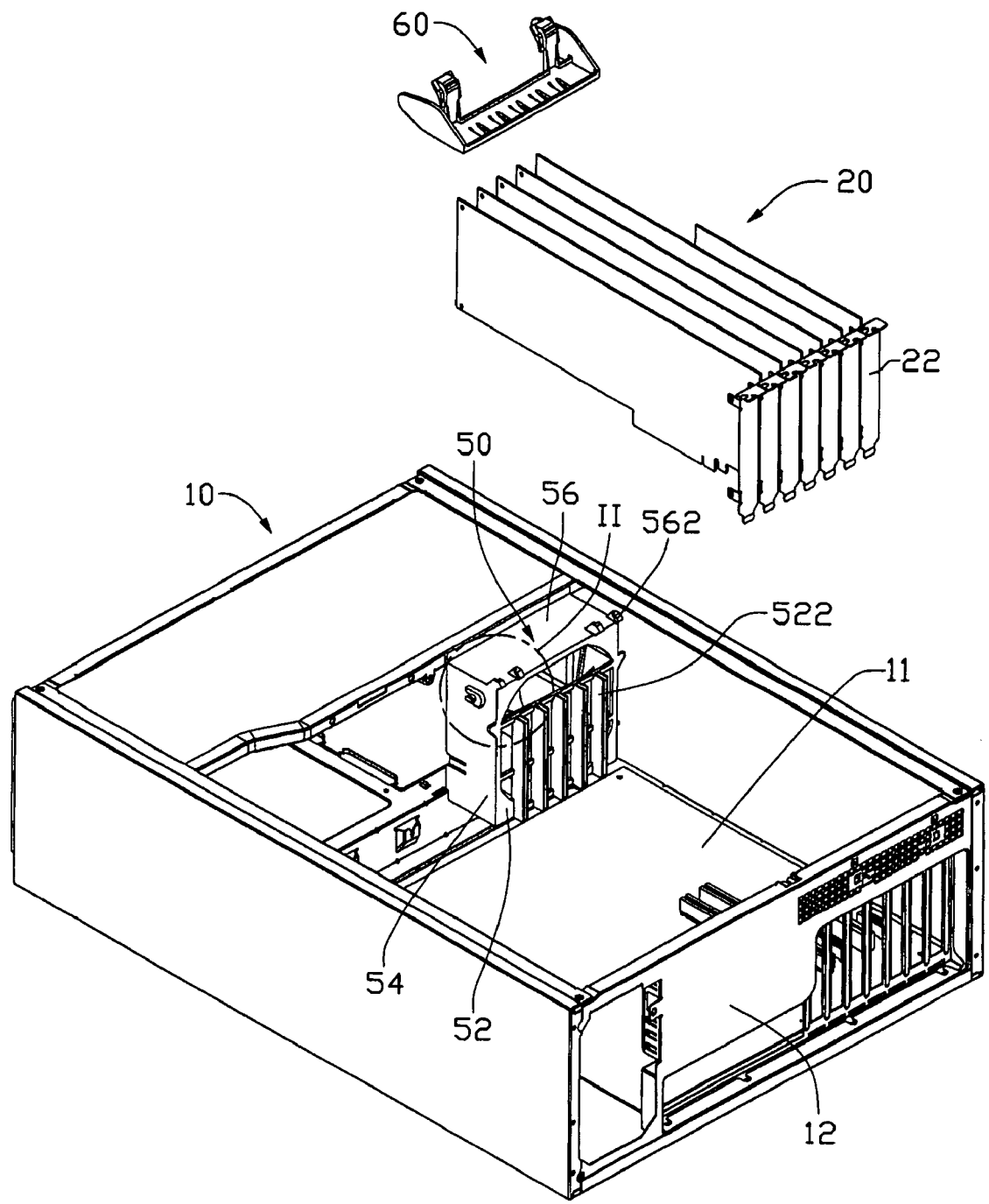
FIG. 1 is an exploded, isometric view of a mounting apparatus in a chassis in accordance with a first preferred embodiment of the present invention, the mounting apparatus including a retention member.

Referring to FIG. 1, a mounting apparatus of an electronic device like a computer for securely mounting a plurality of functional parts such as expansion cards 20 to a chassis 10 of the electronic device in accordance with a first preferred embodiment of the present invention includes a locating member 50, and a retention member 60. The chassis 10 includes a bottom panel 11, and a rear panel 12 perpendicular to the bottom panel 11. The locating member 50 is attached to the bottom wall 11 of the chassis 10. The retention member 60 is rotatably attached to the locating member 50. Each of the expansion cards 20 includes a first end with a cover piece 22 attached thereto, and a second end.

Figure 2:
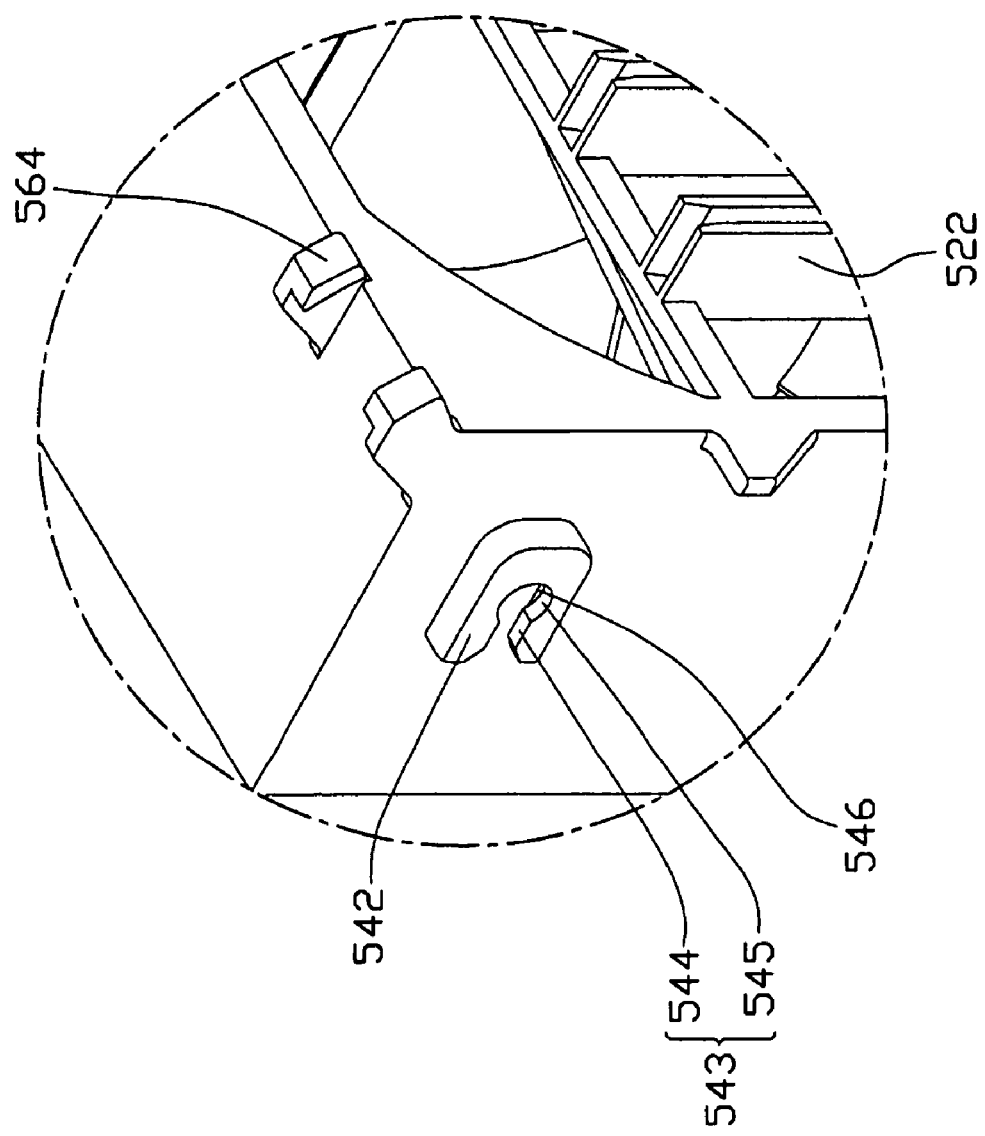
FIG. 2 is an enlarged view of a circled portion II of FIG. 1.

Referring also to FIG. 2, the locating member 50 includes a base wall 52, a pair of sidewalls 54, and a top wall 56. In this preferred embodiment, the locating member 50 is a fan holder installed in the chassis 10 to hold a fan therein. A plurality of pairs of guiding rails 522 extends perpendicularly from the base wall 52, each pair for movably holding the second ends of the expansion cards 20. The top wall 56 includes two pairs of spaced protrusions 562 extending from a rear portion thereof. Each pair of the spaced protrusions 562 forms a first block 564. The sidewalls 54 each include a fixing seat 542 extending therefrom. Each of the fixing seats 542 defines a first groove 543 in an outer portion thereof, and a second groove 546 in an inner portion thereof. Each of the first grooves 543 includes a straight entry 544, and a pivoting hole 545 connecting with the entry 544.

Figure 3:
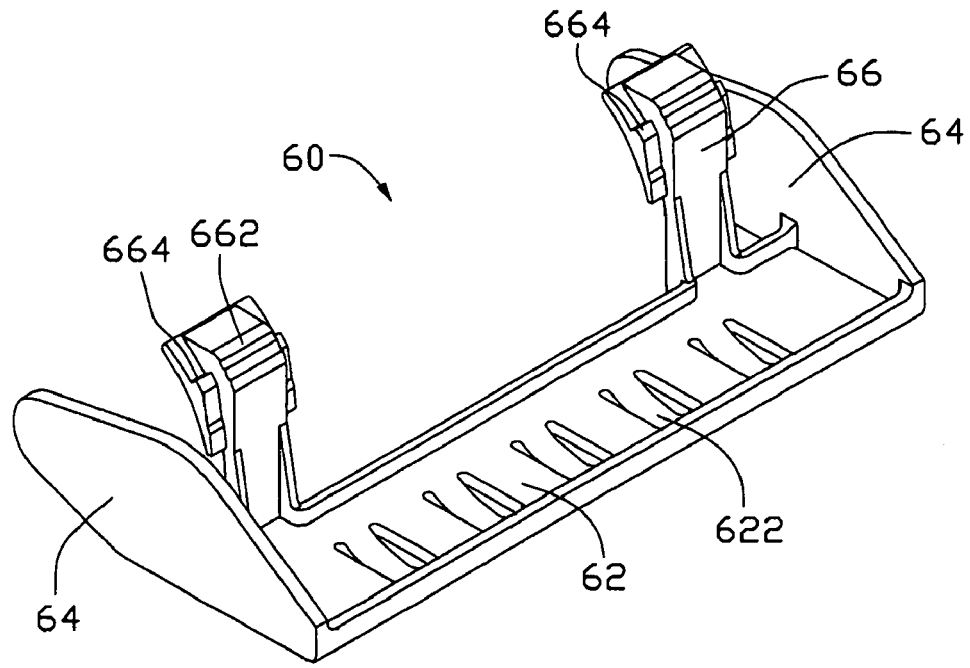
FIGS. 3 and 4 are enlarged, isometric views of the retention member of FIG. 1, but viewed from different aspects.
Figure 4:
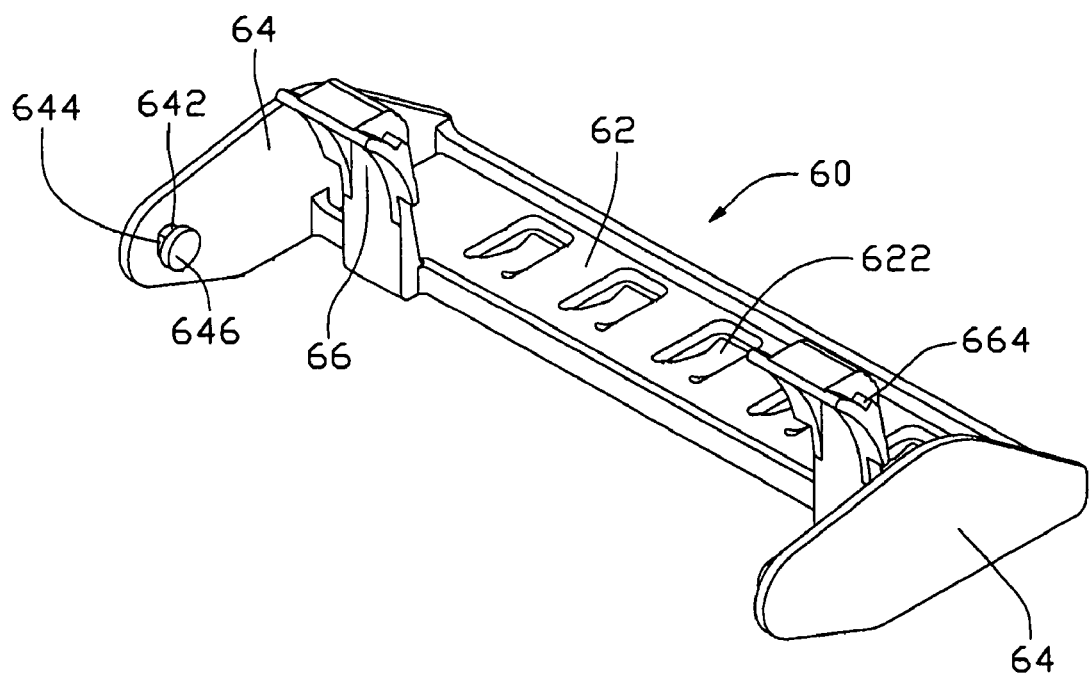

Referring also to FIGS. 3 and 4, the retention member 60 includes a base plate 62, a pair of flanges 64 extending perpendicularly from two opposite ends of the plate 62 respectively, and a pair of resilient arms 66 extending from a front edge of the base plate 62 beside the flanges 64 respectively. A plurality of retaining tabs 622 extends downwardly from the base plate 62. The flanges 64 each include a post 642 extending in from an inner surface thereof. Each of the posts 642 includes a pair of flat surfaces 644 formed thereon, and an enlarged distal end 646. Each of the arms 66 includes a handle portion 662 formed near a distal end thereof, and a pair of second blocks 664 formed at opposite sides of the handle portion 662 respectively. The handle portions 662 define a plurality of teeth in top portions thereof.

Figure 5:
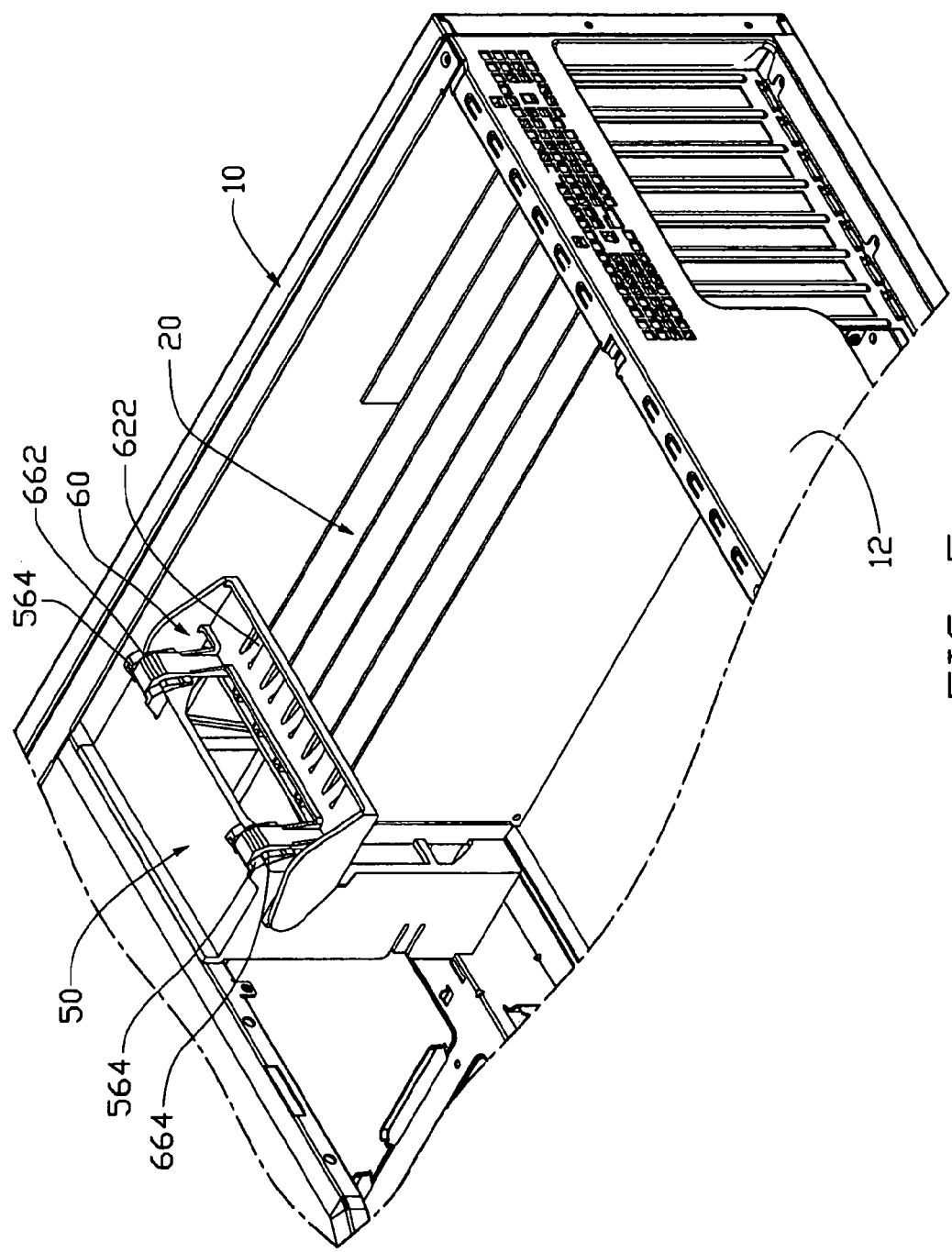
FIG. 5 is a partial view of the chassis with the mounting apparatus of FIG. 1 assembled therein.

Referring also to FIG. 5, in assembly, the retention member 60 is attached to the locating member 50, with the distal ends 646 sliding into the second grooves 546 and the flat surfaces 644 of the posts 64 sliding along the entries 544. The retention member 60 is rotated when the posts 64 move into the pivoting holes 545 of the locating member 50.

The expansion cards 20 are installed in the chassis 10, with second ends thereof sliding along the guiding rails 522 of the locating member 50. Then the retention member 60 is rotated downwardly to rest on the expansion cards 20, with the retaining tabs 622 pressing the top edges of expansion cards 20. The retention member 60 is located on the locating member 50, with the first blocks 564 engaging with the second blocks 664. The covering pieces 22 of the expansion cards 20 are fixed to the rear panel 12 of the chassis 10 by any suitable conventional fixing apparatus. To detach the second ends of the expansion cards 20, the retention member 60 is rotated upwardly, depressing the handle portions 664 to disengage the second positioning blocks 664 from the first positioning blocks 564.

Figure 6:
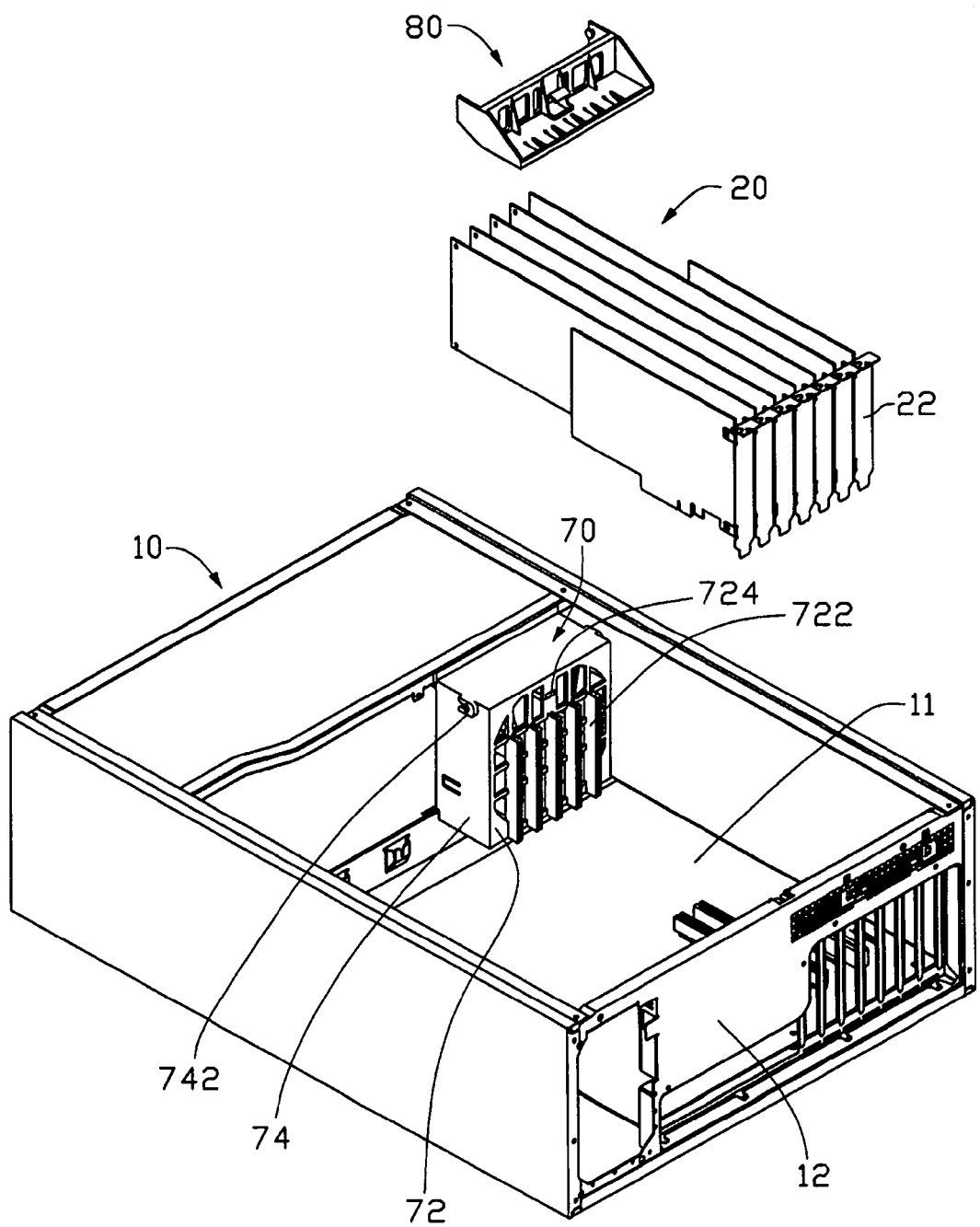
FIG. 6 is an exploded, isometric view of a mounting apparatus in accordance with a second preferred embodiment of the present invention, the mounting apparatus including a retention member.

Referring to FIG. 6, a mounting apparatus in accordance with a second preferred embodiment of the present invention includes a locating member 70, and a retention member 80. The locating member 70 is attached to the bottom wall 11 of the chassis 10. The retention member 80 is rotatably attached to the locating member 70.

In the second preferred embodiment, the locating member 70 is also a fan holder installed in the chassis for holding a fan therein. The locating member 70 includes base wall 72, and a pair of sidewalls 74. A plurality of pairs of guiding rails 722 perpendicularly extends from the base wall 72, each pair for movably holding the second ends of the expansion cards 20. A fixing hole 724 is defined in an upper portion of the base wall 72. A pair of fixing seats 742 extends from the sidewalls 74 respectively, with a similar configuration as the first embodiment.

Figure 7:
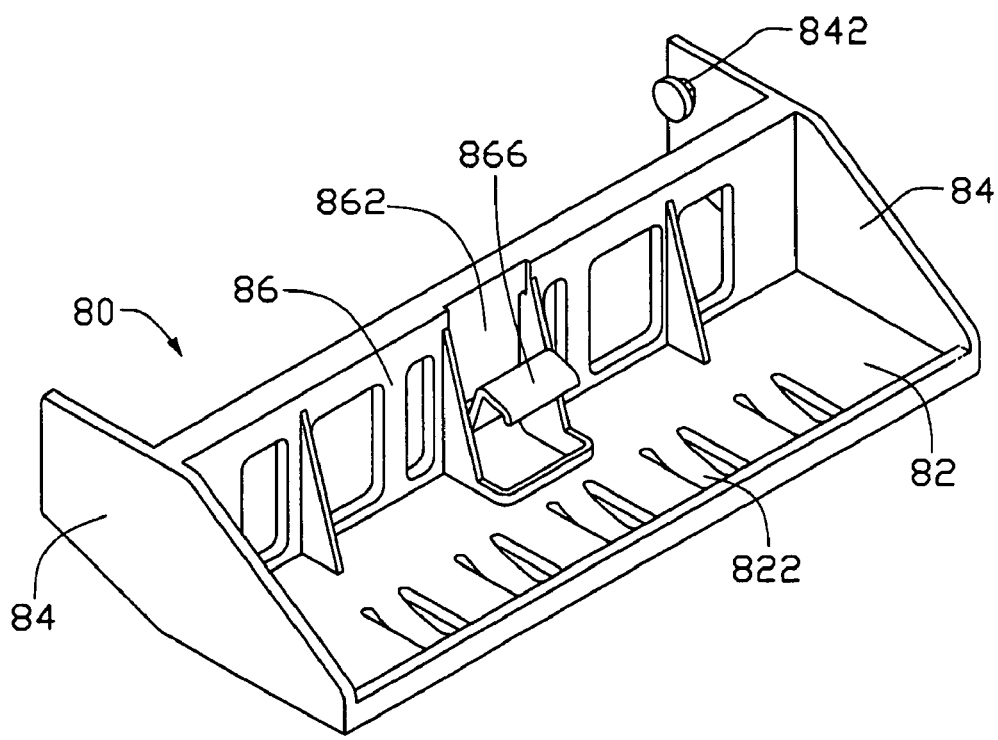
FIGS. 7 and 8 are enlarged, isometric views of the retention member of FIG. 6, but viewed from different aspects.
Figure 8:
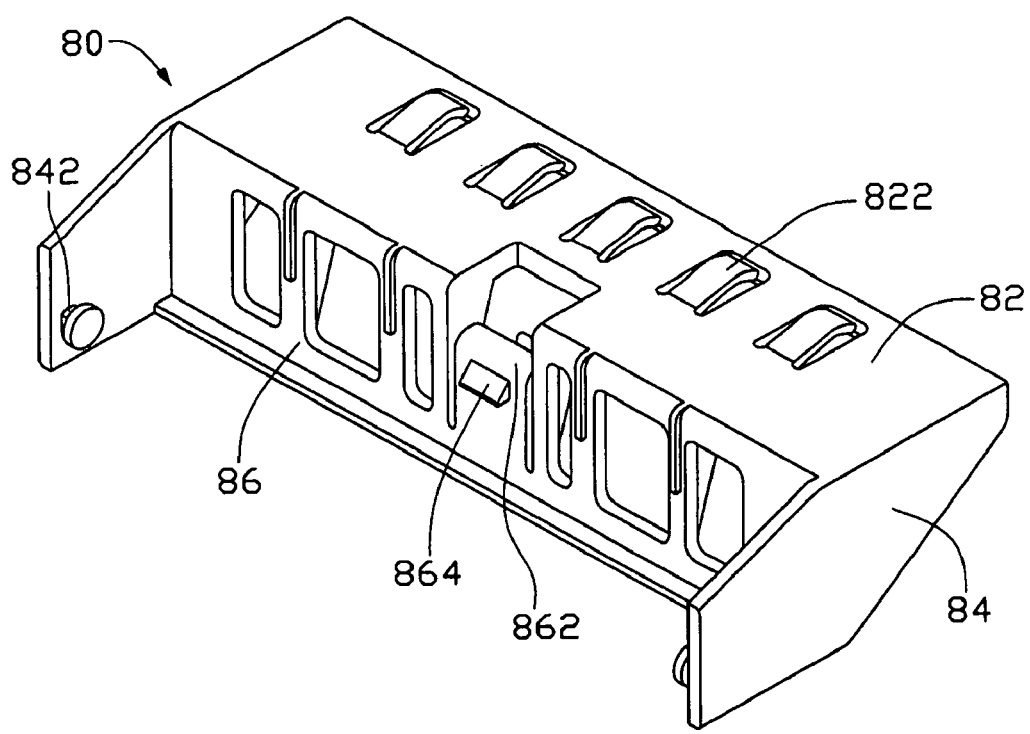

Referring also to FIGS. 7 and 8, the retention member 80 includes a base plate 82, a pair of flanges 84 extending perpendicularly from two opposite ends of the base plate 82 respectively, and a connecting plate 86 extending from a front edge of the base plate 82. A plurality of retaining tabs 822 extends downwardly from the base plate 82. A pair of posts 842 extends in from inner sides of the flanges 84, in a similar configuration as the first embodiment. The connecting plate 86 includes a resilient tab 862 extending therefrom. The resilient tab 862 includes a positioning block 864 extending from the resilient tab 862, and a handle portion 866 extending from a distal end of the resilient tab 862 opposite to the positioning block 864.

In assembly, the retention member 80 is rotatably attached to the locating member 70, with the fixing seats 742 engaging with the posts 842. The expansion cards 20 are installed in the chassis 10, with the second ends thereof sliding into the guiding rails 722. The retention member 80 is rotated downwardly, with the retaining tab 822 pressing the top edges of expansion cards 20. The retention member 80 is located on the locating member 70, with the positioning block 864 engaging in the fixing hole 724 of the locating member 70. To detach the second ends of the expansion cards 20, the retention member 80 is rotated upwardly, moving the handle portions 866 to disengage the positioning block 864 from the fixing hole 724. Then the retention member 80 is rotated upward and away from the expansion cards 20.

It is believed that the present embodiments and their advantages will be understood from the foregoing description, and it will be apparent that various changes may be made thereto without departing from the spirit and scope of the invention or sacrificing all of its material advantages, the example hereinbefore described merely being preferred or exemplary embodiment of the invention.

We claim:

1. An auxiliary mounting apparatus for expansion cards, the auxiliary mounting apparatus comprising:
   a locating member comprising a base wall, and a pair of sidewalls each having a seat extending from the base wall, the base wall comprising a plurality of pairs of guiding rails for slidably locating ends of the expansion cards opposite to ends with cover plates;
   a retention member rotatably attached to the locating member and comprising a base plate, and a pair of flanges each having a post extending from the base plate, the retention member comprising a plurality of retaining tabs for pressing the expansion cards; and
   a positioning mechanism to position the retention member on the locating member,
   wherein each of the posts comprises a pair of flat surfaces formed thereon, each of the seats comprises a first groove in an outer portion thereof, each of the first grooves comprises a straight entry, and a pivoting hole connecting with the entry, the posts are movably received in the seats, respectively.

2. The auxiliary mounting apparatus as claimed in claim 1, wherein the flanges extend from two opposite ends of the base plate respectively, each of the posts extend inward from the flanges, the pair of sidewalls perpendicularly extends from-the base wall.

3. The auxiliary mounting apparatus as claimed in claim 1, wherein each of the posts comprises an enlarged distal end, each of the fixing seats comprises a second groove in an inner portion thereof, the distal ends of the posts are slidably received in the second grooves.

4. The auxiliary mounting apparatus as claimed in claim 1, wherein the positioning mechanism comprises two pairs of spaced first blocks, and two pair of second blocks engaging with the first blocks respectively.

5. The auxiliary mounting apparatus as claimed in claim 4, wherein the locating member further comprises a top wall perpendicularly extending from a top edge of the base wall, the two pairs of first blocks extends from the top wall, the retention member comprises a pair of resilient arms extending from the base plate thereof, the two pairs of second blocks extend from each of the resilient arms respectively, each pair of second blocks extending from opposite sides of the resilient arms respectively.

6. The auxiliary mounting apparatus as claimed in claim 1, wherein the positioning mechanism comprises a fixing hole, and a positioning block engaging in the fixing hole.

7. The auxiliary mounting apparatus as claimed in claim 6, wherein the fixing hole is defined in the base wall of the locating member, the retention member comprises a connecting plate extending from the base plate thereof, the connecting plate comprises a resilient tab extending therefrom, the positioning block extends from the resilient tab in a first direction.

8. The auxiliary mounting apparatus as claimed in claim 7, wherein the retention member comprises a handle portion extending from the resilient tab in a second direction opposite to the first direction.

9. A mounting apparatus assembly comprising:
   a locating member comprising a plurality of guiding rails, a pair of sidewalls each having a seat, and a first positioning portion;
   a plurality of expansion cards comprising ends slidably moving along the guiding rails opposite to ends with cover plates; and
   a retention member rotatably attached to the locating member, the retention member comprising a plurality of retaining tabs for pressing edges of the expansion cards, a pair of flanges each having a post, and a second positioning portion engaging with the first positioning portion to position the retention member,
   wherein each of the posts comprises a pair of flat surfaces formed thereon, each of the seats comprises a first groove in an outer portion thereof, each of the first grooves comprises a straight entry, and a pivoting hole connecting with the corresponding entry, the posts enter the seats via the straight entry and are pivotably received in the pivoting holes.

10. The mounting apparatus assembly as claimed in claim 9, wherein the locating member comprises a base wall, the guiding rails extend from the base wall, the retention member comprises a base plate, the retaining tabs extend from the base plate.

11. The mounting apparatus assembly as claimed in claim 10, wherein the flanges extend from two opposite ends of the base plate respectively, the posts extend in from the flanges, the sidewalls perpendicularly extend from two opposite sides of the base wall.

12. The mounting apparatus assembly as claimed in claim 9, wherein each of the posts comprises an enlarged distal end, each of the fixing seats comprises a second groove in an inner portion thereof, the distal ends of the posts are slidably received in the second grooves.

13. The mounting apparatus assembly as claimed in claim 10, wherein the locating member further comprises a top wall perpendicularly extending from a top edge of the base wall, the first positioning portion is two pairs of first blocks extending from the top wall, the retention member comprises a pair of resilient arms extending from the base plate thereof, the second positioning portion is two pairs of second blocks extending from the resilient arms respectively corresponding to the first blocks.

14. The mounting apparatus assembly as claimed in claim 10, wherein the first positioning portion is a fixing hole defined in the base wall of the locating member, the retention member comprises a connecting plate extending from the base plate thereof, the connecting plate comprises a resilient tab extending therefrom, the second positioning portion is a positioning block extending from the resilient tab.

15. An electronic device comprising:
a chassis enclosing said electronic device, and defining a panel extending along a side thereof;
a plurality of functional parts installable in said chassis beside said panel of said chassis for functional extension of said electronic device, each of said plurality of functional parts comprising a first end retainably attachable to said panel to be user-accessible through said panel, and a second end extending away from said panel;
a locating member installable in said chassis beside said second end of said each of said plurality of functional parts, said locating member comprising a plurality of guiding rails to guidably and respectively receive said second end of said each of said plurality of functional parts therein in order for positioning said each of said plurality of functional parts together with said panel; and
a retention member movably attachable to said locating member beside said plurality of guiding rails so as to fixedly retain said second end of said each of said plurality of functional parts in a corresponding one of said plurality of guiding rails;
wherein the locating member comprises a pair of sidewalls each having a seat, each of the seats comprises a first groove in an outer portion thereof, each of the first grooves comprises a straight entry, and a pivoting hole connecting with the corresponding entry, the retention member comprises a pair of flanges each having a post, each of the posts comprises a pair of flat surfaces formed thereon to enter the straight entry and pivotably engage in the pivoting hole.

16. The electronic device as claimed in claim 15, wherein said retention member comprises a base plate extending across said plurality of guiding rails of said locating member to abut against said second end of said each of said plurality of functional parts for retaining, and at least one flange extending perpendicular to said base plate to movably attach to said locating member.

17. The mounting apparatus assembly as claimed in claim 15, wherein each of the posts comprises an enlarged distal end, each of the fixing seats comprises a second groove in an inner portion thereof, the distal ends of the posts are slidably received in the second grooves.

* * * * *